(12) United States Patent
Cha

(10) Patent No.: US 6,225,854 B1
(45) Date of Patent: May 1, 2001

(54) VOLTAGE BOOSTING CIRCUIT HAVING CROSS-COUPLED PRECHARGE CIRCUITS

(75) Inventor: Gi-Won Cha, Suwon (KR)

(73) Assignee: Samsung Electronics Co., Ltd, Suwon-City (KR)

(*) Notice: Subject to any disclaimer, the term of this patent is extended or adjusted under 35 U.S.C. 154(b) by 0 days.

(21) Appl. No.: 09/328,865

(22) Filed: Jun. 9, 1999

(30) Foreign Application Priority Data

Jun. 9, 1998 (KR) .................................................. 98-21235

(51) Int. Cl.[7] .......................................................... G05F 3/02
(52) U.S. Cl. ............................................. 327/536; 327/537
(58) Field of Search ..................................... 327/534, 536, 327/537

(56) References Cited

U.S. PATENT DOCUMENTS

| | | | |
|---|---|---|---|
| 5,266,842 | * 11/1993 | Park ............................................ | 327/536 |
| 5,444,362 | * 8/1995 | Chung et al. ............................. | 327/536 |
| 5,521,547 | * 5/1996 | Tsukada .................................... | 327/537 |
| 5,521,871 | * 5/1996 | Choi ........................................... | 327/536 |
| 5,532,640 | * 7/1996 | Okunaga .................................. | 327/536 |
| 5,602,794 | * 2/1997 | Javanifard et al. ....................... | 327/184 |
| 5,677,645 | * 10/1997 | Merritt ....................................... | 326/536 |
| 5,828,095 | * 10/1998 | Merritt ....................................... | 257/299 |

* cited by examiner

Primary Examiner—Terry D. Cunningham
(74) Attorney, Agent, or Firm—Marger Johnson & McCollom, P.C.

(57) ABSTRACT

A power supply boosting circuit provides increased pumping efficiency by driving the gate of a transistor in a first precharge circuit with the pumped output voltage from a second precharge circuit, thereby eliminating a threshold voltage drop from the output voltage of the first precharge circuit. The pumped output voltage from the first precharge circuit is then used to precharge a pumping node in a pumping circuit, which in turn, eliminates a threshold voltage drop from the output voltage of the pumping circuit. A transistor in the second precharge circuit can likewise be driven by the pumped output voltage from the first precharge circuit, further increasing the pumping efficiency.

18 Claims, 6 Drawing Sheets

VOLTAGE BOOSTING CIRCUIT HAVING CROSS-COUPLED PRECHARGE CIRCUITS

BACKGROUND OF THE INVENTION

This application claims priority from Korean patent application No. 98-21235 filed Jun. 9, 1998 in the name of Samsung Electronics Co., Ltd., which is incorporated by reference.

1. Field of the Invention

The present invention relates generally to voltage boosting circuits, and more particularly, to power supply voltage boosting circuits having cross-coupled precharge circuits.

2. Description of the Related Art

Signals in dynamic random access memories (DRAMs) constructed using CMOS transistor technology experience a voltage drop of somewhat more than the threshold voltage of a MOS transistor while being transmitted through the channel region of the MOS transistor. Such voltage drops can cause information loss and interfere with data read and write operations.

Continuous increases in the density and capacity of semiconductor memory devices have caused a commensurate increase of power consumption. Therefore, semiconductor memory devices use internal power supply voltages to reduce power consumption and enhance reliability.

To correctly read and write data from or to a memory cell composed of a MOS transistor and a capacitor, a voltage sufficient to overcome the threshold voltage of the MOS transistor must be provided. For example, the internal power supply voltage is typically boosted by 1.5V to drive word lines that are connected to the gates of the MOS transistors.

Figure 1:
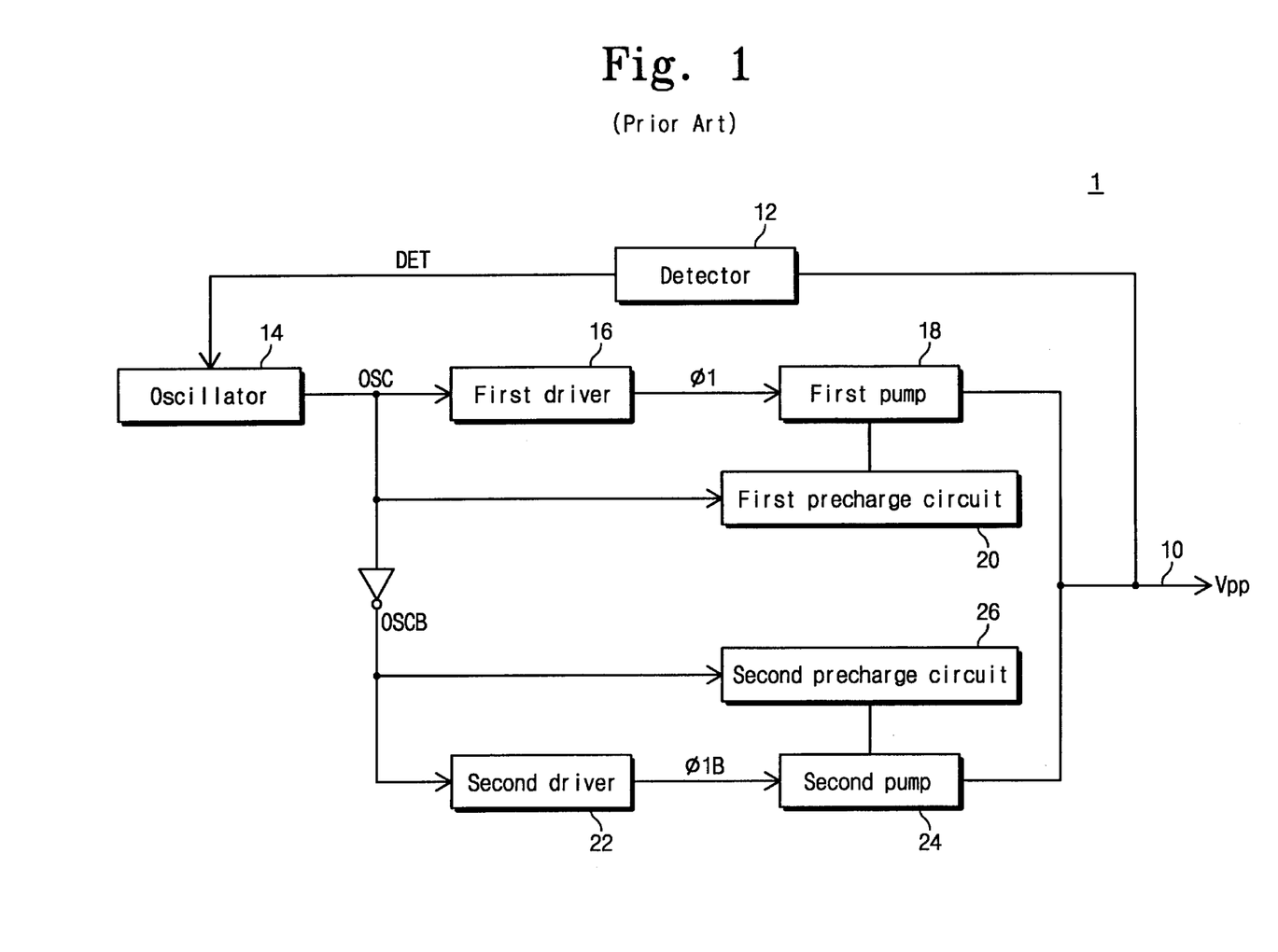
FIG. 1 is a block diagram showing a conventional power supply voltage boosting circuit.
Figure 2:
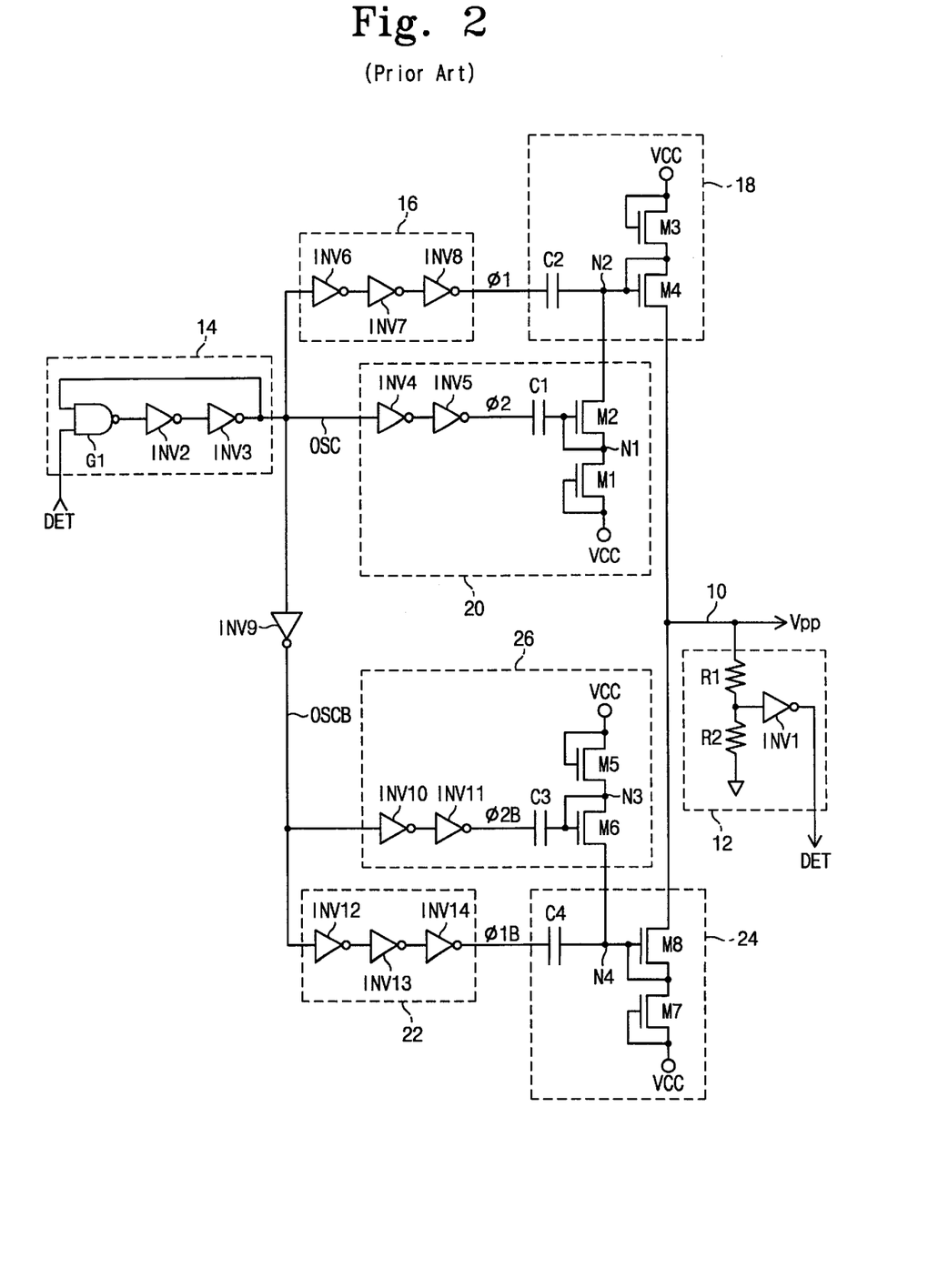
FIG. 2 is a circuit diagram showing more details of the conventional power supply voltage boosting circuit illustrated in FIG. 1.

FIG. 1 is a block diagram of a conventional power supply voltage boosting circuit, and FIG. 2 is a circuit diagram showing more details of the circuit of FIG. 1.

Referring to FIG. 1, the power supply voltage boosting circuit shown generally at 1 generates a boosted voltage Vpp which is higher than a power supply voltage (for example the internal power supply voltage Vcc) and includes a detector 12, oscillator 14, first and second drivers 16 and 22, first and second pumping circuits 18 and 24 (also referred to as main pumping circuits), and first and second precharge circuits 20 and 26.

Detector 12, which detects whether the voltage Vpp is higher than a predetermined target voltage level, is coupled to a power line 10 which transfers the voltage Vpp to other circuits. Detector 12 generates a signal DET which goes low to disable the oscillator 14 when Vpp is higher than the target level. When Vpp is lower than the target level, detector 12 drives the signal DET to a logic high level to enable the oscillator. As shown in FIG. 2, detector 12 includes to resistors R1 and R2 coupled in series between the power line 10 and a power supply ground terminal. An inverter INV11 has in input terminal connected to the node between R1 and R2 and an output terminal for generating the signal DET.

Referring again to FIG. 1, oscillator 14 generates an oscillation signal OSC which is enabled or disabled in response to the detection signal DET. When DET is high, the oscillator 14 outputs the oscillation signal OSC which oscillates with a predetermined period. When DET is low, the oscillation signal OSC is disabled and remains, for example, at a logic high level. As shown in FIG. 2, oscillator 14 includes a 2-input NAND gate G1 and two series connected inverters INV2 and INV3. Referring again to FIG. 1, the first driver 16, the first pumping circuit 18 and the first precharge circuit 20 form a first boosted voltage generating section which performs a pumping operation to raise the potential of power line 10 during a first half period of the oscillation signal OSC. As shown in FIG. 2, the first driver 16 includes 3 series connected inverters INV6, INV7 and INV8, which receive the oscillating signal OSC and output a first signal φ1.

The first pumping circuit 18 includes a pumping capacitor C2 and two NMOS transistors M3 and M4. Transistor M3 is diode-connected between Vcc and a pumping node N2, and M4 is diode-connected between node N2 and the power line 10. Capacitor C2 is connected between the output of the first driver 16 and the gate of M4 at node N2. The first precharge circuit 20 includes two inverters INV4 and INV5, a pumping capacitor C1, and two NMOS transistors M1 and M2. Inverters INV4 and INV5 are connected in series to generate a second signal φ2 in response to OSC. Transistor M1 is diode-connected between Vcc and a pumping node N1, while M2 is diode-connected between nodes N1 and N2. Capacitor C1 is connected between the gate of M2 at node N1 and the output of INV5 to receive the signal φ2.

Referring back to FIG. 1, the second driver 22, the second pumping circuit 24, and the second precharge circuit 26 form a second boosted voltage generating section which performs a pumping operation to raise the potential of power line 10 during a second half period of the oscillation signal OSC. As shown in FIG. 2, the constituent components of the second boosted voltage generating section are essentially identical to those of the first section, with pumping nodes N3 and N4 corresponding to pumping nodes N1 and N2, respectively, and signals φ2B and φ1B corresponding to signals φ1 and φ2, respectively. However, the second precharge circuit 26 and the second driver 22 are driven by a second oscillating signal OSCB which is complement of OSC and is obtained through inverter INV9. Because the two sections operate during alternate half cycles of the oscillation signal OSC, two pumping operations are performed during each cycle of OSC.

The operation of the power supply voltage boosting circuit 1 will now be described more thoroughly with reference to FIGS. 1 and 2.

When the oscillation signal OSC switches from a high to a logic low level, capacitor C1 in the first precharge circuit 20 performs a negative pumping operation so that node N1 is charged to a voltage of VCC-Vtn via the transistor M1 (where Vtn represents a threshold voltage of an N-type MOS transistor). Since the output signal φ1 from the first driver 16 switches to a logic high level, node N2 in the first pumping circuit 18 is boosted to 2VCC-Vtn via capacitor C2.

At the same time, since the output signal φ1B from the second driver 22 switches to a logic low level, capacitor C4 in the second pumping circuit 24 performs a negative pumping operation so that node N4 is charged to a voltage of VCC-Vtn via the NMOS transistor M7. Node N3 in the second precharge circuit 26 is boosted to 2VCC-Vtn by the capacitor C3, so that node N4 is then precharged to a voltage of 2VCC-2Vtn. Hereinafter, the above described operation is referred to as "a precharge pumping operation".

When the oscillation signal OSC switches from a low to a logic high level, the power line 10 is boosted to 3VCC-3Vtn by the second pumping circuit 24, and node N2 is precharged to a voltage of 2VCC-2Vtn through the first precharge circuit 20.

More specifically, at the low-to-high transition of OSC, the signal φ1B from the second driver 22 goes high, so node N4 is boosted to 3VCC-2Vth via capacitor C4. Therefore, the power line 10 is boosted to 3VCC-3Vtn through NMOS transistor M8 (hereinafter, the above described operation is referred to as "a main pumping operation"). Capacitor C3 performs a negative pumping operation, so node N3 is charged to a voltage of VCC-Vtn. At the same time, capacitor C2 in the first pumping circuit 18 performs a negative pumping operation because the signal φ1 from the first driver 16 switches to a logic low level. Capacitor C1 pumps node N1 in the first precharge circuit 20 to a voltage of 2VCC-Vtn in response to the signal φ2 from the invertor INV5 so that node N4 is precharged to a voltage of 2VCC-2Vtn. That is, the precharge pumping operation is performed.

As described above, at the low-to-high transition of the oscillation signal OSC, the precharge pumping operation for node N2 is performed while the second pumping circuit 24 performs the main pumping operation. On the other hand, at the high-to-low transition of the oscillation signal OSC, the precharge pumping operation for node N4 is performed while the first pumping circuit 18 performs the main pumping operation. Therefore, according to the above described boosting circuit structure, it is possible to speed up the pumping operation because the two pumping operations are performed during alternate half-cycles of the oscillation signal OSC.

However, the threshold voltage drops of the NMOS transistors M1 and M5 in the first and second precharge circuits 20 and 26 reduce the pumping efficiency. That is, since node N1 is charged to a voltage of VCC-Vtn before the precharge pumping operation, node N2 has a voltage of 2VCC-2Vtn after the precharge pumping operation. Therefore, when the main pumping operation is performed, the voltage Vpp on the power line 10 is only pumped to 3VCC-3Vtn. If the power supply voltage VCC is about 2 volts and the threshold voltage Vtn is about 1 volt, the voltage Vpp on the power line 10 is only pumped to about 3 volts (3×2volts−3×1 volt) which is inadequate to sufficiently turn on a memory cell transistor when it is applied to the gate of the transistor. As a result, the circuit 1 illustrated in FIG. 2 has a low pumping efficiency. Furthermore, if the power supply voltage VCC is reduced, the pumping efficiency of the circuit of FIG. 2 becomes even lower due to the threshold voltage drops of the transistors M1 and M5.

SUMMARY OF THE INVENTION

In a power supply voltage boosting circuit according to the present invention, the gate of a transistor in a first precharge circuit is driven by a pumped precharge voltage generated in a second precharge circuit, thereby eliminating a threshold voltage drop from a pumping node in the first precharge circuit. This allows the first precharge circuit to pump a node in a pumping circuit to a higher precharge voltage level, which in turn, eliminates a threshold voltage drop from the output voltage of the pumping circuit, thereby increasing the pumping efficiency of the power supply boosting circuit.

A transistor in the second precharge circuit can likewise be driven by the pumped precharge voltage from the first precharge circuit, further increasing the pumping efficiency.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

Figure 3:
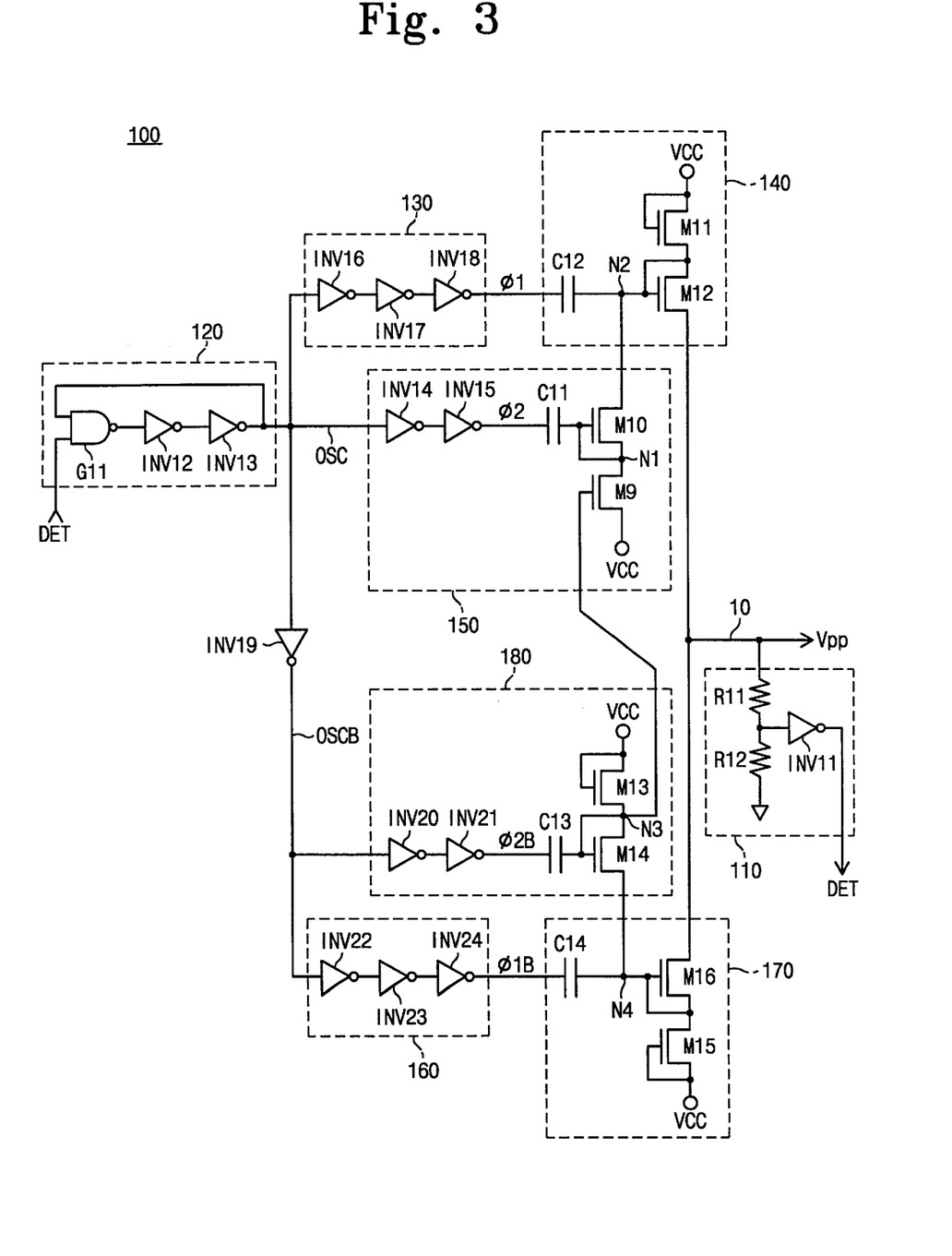
FIG. 3 is a first embodiment of a power supply voltage boosting circuit according to the present invention.
Figure 4:
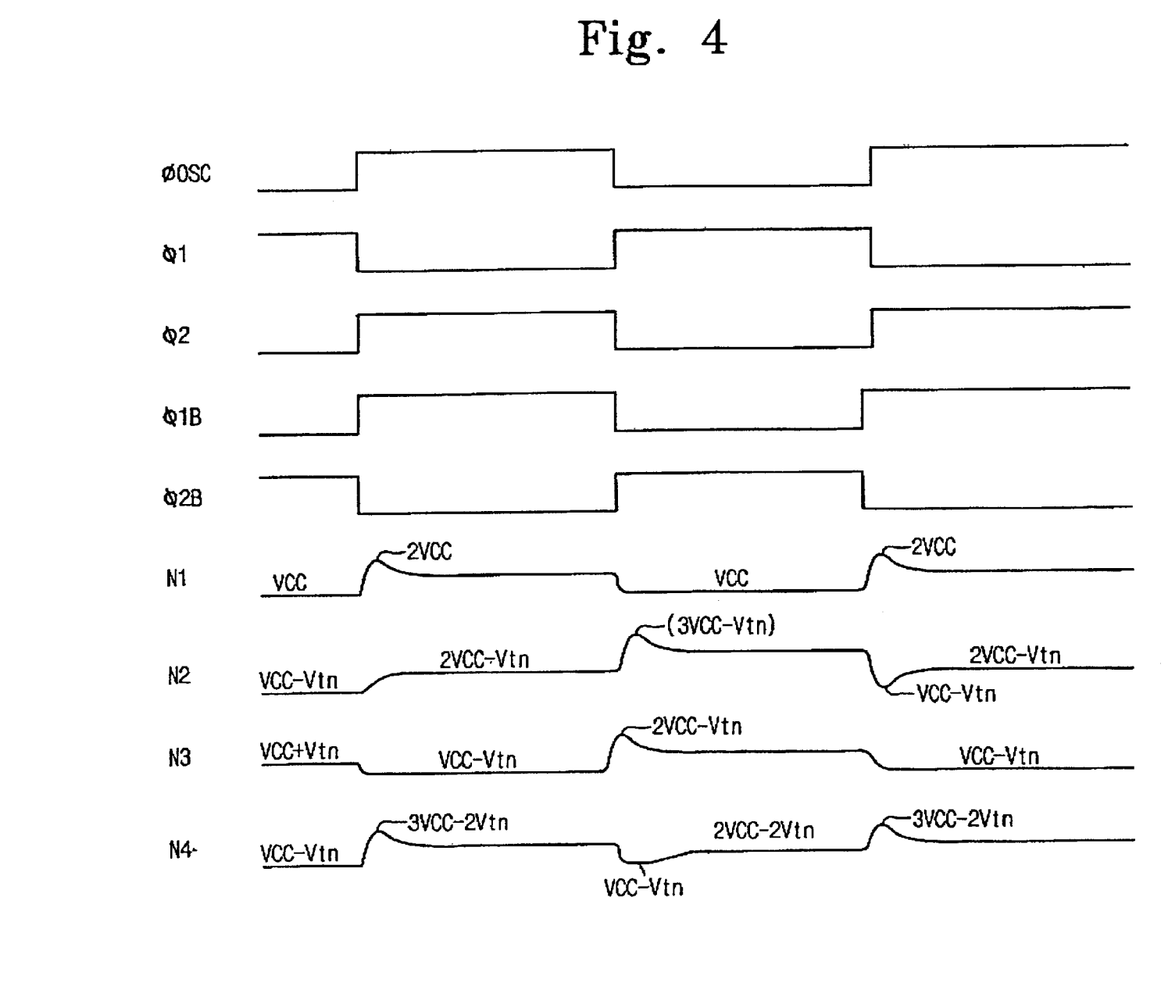
FIG. 4 is a diagram showing voltage levels at various nodes of the power supply voltage boosting circuit illustrated in FIG. 3.

FIG. 3 is a first embodiment of a power supply voltage boosting circuit according to the present invention, and FIG. 4 is a diagram showing voltage levels at various nodes of the power supply voltage boosting circuit 100 illustrated in FIG. 3.

The power supply voltage boosting circuit 100 shown in FIG. 3 differs from the conventional boosting circuit 1 shown in FIG. 2 in that NMOS transistor M9 in the first precharge circuit 150 is not arranged in a diode-connected configuration, but instead, the gate of M9 is connected to node N3 in the second precharge circuit 180. As a result of this configuration, the voltage applied to the gate of M9 is sufficient to overcome the threshold voltage of transistor M9. Therefore, node N1 in the first precharge circuit 150 is charged to a voltage of VCC instead of VCC-Vtn.

The operation of the power supply voltage boosting circuit 100 according to the first embodiment of the present invention will be more fully described with reference to FIGS. 3 and 4.

When the oscillation signal OSC switches from a logic high level to a logic low level, capacitor C11 in the first precharge circuit 150 performs a negative pumping operation so that node N1 is charged via NMOS transistor M9 whose gate is coupled to node N3. Since the signal φ1 from the first driver 130 switches to a logic high level, the capacitor C12 pumps node N2 in the first pumping circuit 140 to a voltage of 2VCC-Vtn.

At the same time, the capacitor C14 in the second pumping circuit 170 performs a negative pumping operation because the signal φ1B from the second driver 160 switches to a logic low level, thus node N4 is charged to a voltage of VCC-Vtn. The capacitor C13 in the second precharge circuit 180 pumps node N3 to 2VCC-Vtn. Node N4 is precharged to a voltage of 2VCC-2Vtn via the NMOS transistor M14. That is, the precharge pumping operation has been performed.

It can be seen that the gate voltage of the transistor M9 is raised to 2VCC-Vtn during the precharge pumping operation for node N4 (that is, at the high-to-low transition of the oscillation signal OSC). Therefore, node N1 in the precharge circuit 150 is charged to the power supply voltage VCC instead of VCC-Vtn.

As the oscillation signal OSC repeatedly transitions from a logic low level to a logic high level, the main pumping operation associated with the second pumping circuit 170 is performed repeatedly. More specifically, when the signal φ1B from the second driver 160 transitions to a logic high level, node N4 is boosted to 3VCC-2Vth via capacitor C14. Therefore, a voltage of 3VCC-3Vtn is delivered to the power line 10 through NMOS transistor M16 (that is, the main pumping operation has been performed). At this time, the capacitor C3 performs a negative pumping operation, thus node N3 is charged to a voltage of VCC-Vtn.

The precharge operation for node N2 is performed at the low-to-high transition of the oscillation signal OSC. More specifically, capacitor C12 in the first pumping circuit 140 performs a negative pumping operation because the signal φ1 from the first driver 130 switches to a logic low level. Capacitor C11 pumps node N1 in the first precharge circuit 150 to 2VCC because node N1 is charged to VCC at the previous high-to-low transition of the oscillation signal OSC. Therefore, node N2 is precharged to a voltage of 2VCC-Vtn instead of 2VCC-2Vtn (that is, the precharge pumping operation has been performed).

When the oscillation signal OSC transitions from a logic high level to a logic low level, capacitor C12 pumps node N2 in response to the logic high level of signal φ1 from the first driver, so that node N2 is boosted to a voltage of 3VCC-Vtn. Therefore, the potential on the power line 10 is raised further.

In the above-described power supply voltage boosting circuit 100, the gate of transistor M9 is supplied with a voltage sufficient to overcome its threshold voltage drop (for example, a voltage higher than VCC+Vtn). This enables node N1 to be charged to the power supply voltage VCC, resulting in an increase in the pumping efficiency of the power supply voltage boosting circuit 100.

Figure 5:
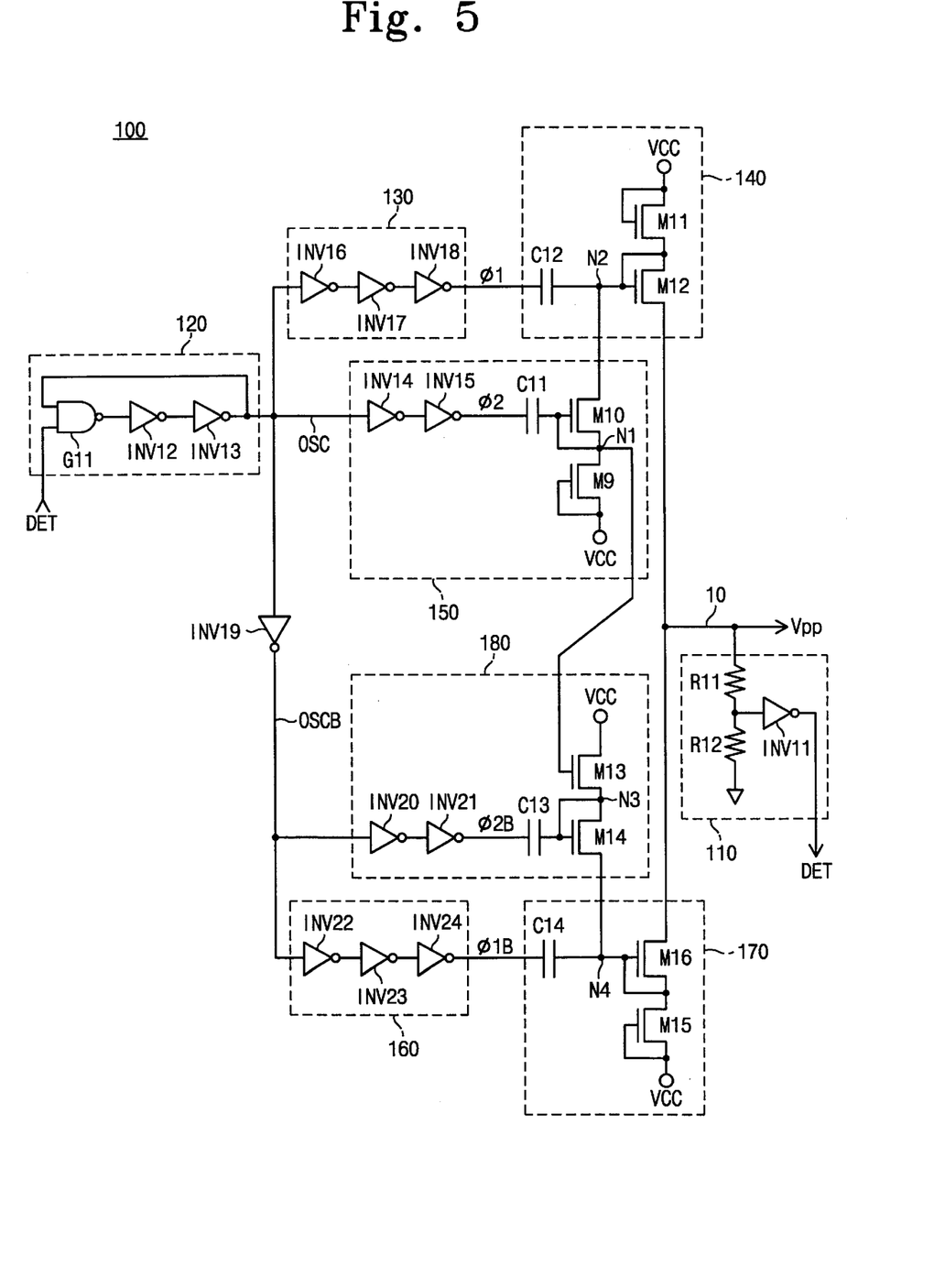
FIG. 5 is a second embodiment of a power supply voltage boosting circuit according to the present invention.

FIG. 5 is a second embodiment of a power supply voltage boosting circuit 100 according to the present invention. In FIG. 5, the constituent elements that are identical to those in FIG. 3 are labeled with the same or like reference numerals.

The power supply voltage boosting circuit 100 according to the second embodiment of the present invention differs from the conventional boosting circuit 1 shown in FIG. 2 in that the gate of NMOS transistor M13 in the second precharge circuit 180 is connected to node N1 in the first precharge circuit 150. Due to this configuration, a voltage sufficient to overcome the threshold voltage of NMOS transistor M13 is supplied to the gate of transistor M13.

The operation of the second embodiment of the power supply voltage boosting circuit 100 according to the present invention will be more fully described with reference to FIG. 5.

When the oscillation signal OSC transitions from a logic high level to a logic low level, capacitor C11 in the first precharge circuit 150 performs a negative pumping operation, so that node N1 is charged to a voltage of VCC-Vtn. Since the signal φ1 from the first driver 130 switches to a logic high level, capacitor C12 pumps node N2 in the first pumping circuit 140 to a voltage of 2VCC-Vtn.

At the same time, capacitor C14 in the second pumping circuit 170 performs a negative pumping operation because the signal φ1B from the second driver 160 switches to a logic low level, and then node N4 is charged to a voltage of VCC-Vtn. At this time, capacitor C13 pumps node N3 in response to the logic high level on signal φ2B so node N3 is charged to a voltage less than 2VCC-Vtn because the gate of NMOS transistor M13 is connected to node N1. As a result, node N4 is precharged to a voltage less than 2VCC-2Vtn via NMOS transistor M14.

When the oscillation signal OSC transitions from a logic low level to a logic high level, a main pumping operation is performed by the second pumping circuit 170. That is, capacitor C14 pumps node N4 in response to the signal φ1B from the second driver 160 transitioning to a logic high level. The boosted voltage on node N4 is then transferred to the power line 10 through NMOS transistor M16.

The precharge operation for node N2 is also performed at the low-to-high-transition of the oscillation signal OSC. In particular, capacitor C12 performs a negative pumping operation in response to the signal φ1 being at a logic low level, and capacitor C11 pumps node N1 in the first precharge circuit 150 in response to the logic high level of signal φ2 from the invertor INV15 to charge N1 to a voltage of 2VCC-Vtn. As a result, node N2 is precharged to a voltage of 2VCC-2Vtn.

At this time, it can be seen that a voltage sufficient to overcome the threshold voltage drop of the transistor M13 is supplied to the gate of the transistor M13 from node N1 so that node N3 is charged to VCC. Then, at the high-to-low transition of the oscillation signal OSC, node N4 is precharged to a voltage of 2VCC-Vtn as set forth above. When the oscillation signal OSC transitions from a logic low level to a logic high level, capacitor C14 pumps node N4 to a voltage of 3VCC-Vtn. Therefore, the power line 10 is raised to a voltage of 3VCC-2Vtn during the main pumping operation.

In the above described power supply voltage boosting circuit 100 of FIG. 5, the gate of transistor M13 is supplied with a voltage (for example, a voltage higher than VCC+Vtn) sufficient to overcome its threshold voltage drop. This enables node N3 to be charged to VCC, thereby increasing the pumping efficiency of the circuit 100.

Figure 6:
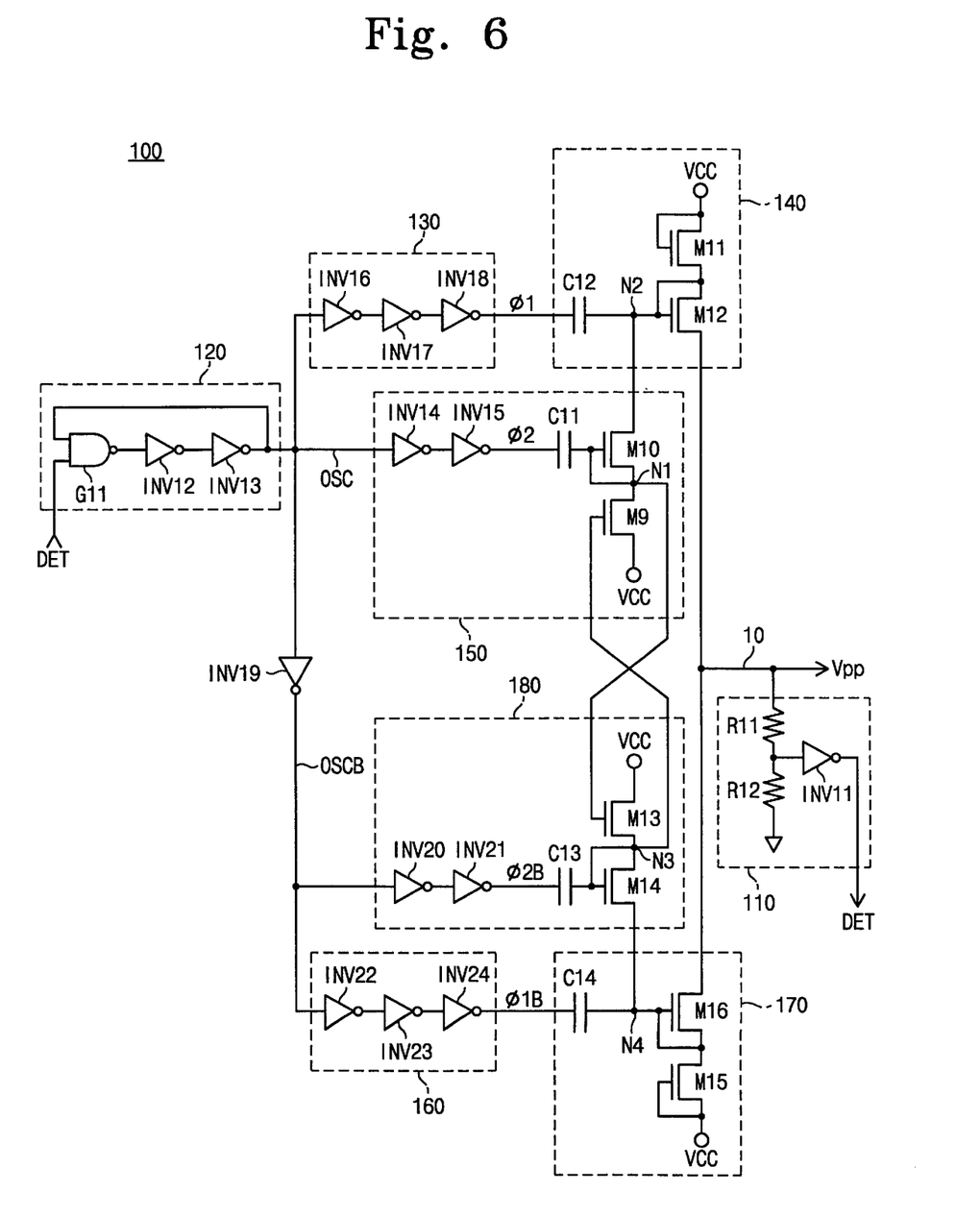
FIG. 6 is a third embodiment of a power supply voltage boosting circuit according to the present invention.

FIG. 6 shows a third embodiment of a power supply voltage boosting circuit 100 according to the present invention. In FIG. 6, the constituent elements that are identical to those in FIGS. 3 and 5 are labeled with the same or like reference numerals.

As shown in FIG. 6, the third embodiment of the power supply voltage boosting circuit 100 differs from the conventional boosting circuit 1 as follows. As with the first embodiment of the present invention, the gate of transistor M9 in the first precharge circuit 150 is coupled to node N3 in the second precharge circuit 180. And, as with the second embodiment of the present invention, the gate of transistor M13 in the second precharge circuit 180 is coupled to node N1 in the first precharge circuit 150.

As a result of the above described circuit configuration, it can be seen that nodes N1 and N3 are charged up to the power supply voltage VCC because a voltage sufficient to overcome the threshold voltage drop is supplied to the gates of transistors M9 and M13. Nodes N2 and N4 are precharged to 2VCC-Vtn instead of 2VCC-2Vtn during their respective precharge pumping operation, and then during the respective main pumping operations, the power line 10 is boosted to 3VCC-2Vtn through the pumping circuits 140 and 170. Accordingly, the power supply voltage boosting circuit 100 according to the third embodiment has an even higher pumping efficiency than that of the first and second embodiments.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A circuit for generating a boosted voltage from a power supply voltage, the circuit comprising:

a power line for transferring the boosted voltage;

an oscillation circuit for generating an oscillation signal;

first boosted voltage generating means for pumping charge by use of the power supply voltage and the oscillation signal to supply a first charge-pumped voltage to the power line during a first half-cycle of the oscillation signal, wherein the first boosted voltage generating means comprises first precharge means and first pumping means; and second boosted voltage generating means for pumping charge by use of the power supply voltage and the oscillation signal to supply a second charge-pumped voltage to the power line during a second half-cycle of the oscillation signal, wherein the second boosted voltage generating means comprises second precharge means and second pumping means;

wherein the second precharge means utilizes a precharge voltage which is pumped by the first precharge means.

2. The circuit according to claim 1, further comprising means for disabling the oscillation circuit when the boosted voltage reaches a predetermined target voltage level.

3. A power supply voltage boosting circuit comprising:

a power line for transferring a boosted voltage;

an oscillation circuit coupled to the power line for generating an oscillation signal when the boosted voltage is lower than a predetermined target voltage level;

a first precharge circuit coupled to the oscillation circuit for performing a precharge pumping operation to generate a precharge voltage in response to the oscillation signal;

a first pumping circuit coupled to the first precharge circuit and the power line for performing a main pumping operation in response to a complementary oscillation signal to boost the potential of the power line;

a second precharge circuit having a pumping node and a transistor having a first terminal coupled to the pumping node, a second terminal coupled to a power supply terminal, and a third terminal coupled to receive the precharge voltage generated in the first precharge circuit, wherein the second precharge circuit performs a precharge pumping operation in response to the complementary oscillation signal; and a second pumping circuit coupled to the second precharge circuit and the power line for performing a main pumping operation in response to the oscillation signal to boost the potential of the power line.

4. The power supply voltage boosting circuit according to claim 3, wherein:

the first precharge circuit and the second pumping circuit perform a precharge pumping operation and a main pumping operation, respectively, at a first transition of the oscillation signal; and the second precharge circuit and the first pumping circuit perform a precharge pumping operation and a main pumping operation, respectively, at a second transition of the oscillation signal.

5. The power supply voltage boosting circuit according to claim 3, wherein the second precharge circuit further includes a second transistor which is diode-connected between the pumping node and the second pumping circuit.

6. The power supply voltage boosting circuit according to claim 3, further including a detector coupled between the power line and the oscillation circuit for generating a detection signal which disables the oscillation circuit when the boosted voltage reaches a predetermined target voltage level.

7. A power supply voltage boosting circuit comprising:

a power line for transferring a boosted voltage;

an oscillation circuit for generating an oscillation signal when the boosted voltage is lower than a predetermined target voltage level;

a first precharge circuit having a first pumping node and a first transistor having a first terminal coupled to the first pumping node and a second terminal coupled to a power supply voltage, wherein the first precharge circuit performs a precharge pumping operation in response to a first transition of the oscillation signal and generates a first precharge voltage at the first pumping node;

a first pumping circuit coupled to the first precharge circuit and the power line for performing a main pumping operation in response to a second transition of the oscillation signal and boosting the potential of the power line;

a second precharge circuit having a second pumping node and a second transistor having a first terminal coupled to the second pumping node, a second terminal coupled to the power supply voltage and a third terminal coupled to the first pumping node to receive the first precharge voltage, wherein the second precharge circuit performs a precharge pumping operation in response to the second transition of the oscillation signal and generates a second precharge voltage at the second pumping node; and a second pumping circuit coupled to the second precharge circuit and the power line for performing a main pumping operation in response to the first transition of the oscillation signal and boosting the potential of the power line.

8. The power supply voltage boosting circuit according to claim 7, wherein a third terminal of the first transistor is connected to the second pumping node so as to receive the second precharge voltage.

9. The power supply voltage boosting circuit according to claim 7, further including a detector for disabling the oscillation circuit when the boosted voltage reaches a predetermined target voltage level.

10. The power supply voltage boosting circuit according to claim 7, wherein:

the first precharge circuit further comprises a third transistor having a third terminal and a second terminal commonly connected to the first pumping node, and a first terminal connected to the first pumping circuit; and the second precharge circuit further comprises a fourth transistor having a third terminal and a second terminal commonly connected to the second pumping node, and a first terminal connected to the second pumping circuit.

11. A power supply voltage boosting circuit for a semiconductor device, comprising:

a power line for delivering a boosted voltage;

an oscillator for generating an oscillation signal;

a detector for enabling the oscillation signal when the boosted voltage is lower than a target voltage level;

a first boosted voltage generating section coupled to the power line and having a first pumping circuit and a first precharge circuit; and a second boosted voltage generating section coupled to the power line and having a second pumping circuit and a second precharge circuit;

wherein the first and second precharge circuits are coupled together such that one of the precharge circuits uses a voltage which is pumped by the other precharge circuit.

12. The power supply voltage boosting circuit according to claim 11, wherein the first and second precharge circuits are coupled together such that each of the precharge circuits uses a voltage which is pumped by the other precharge circuit.

13. A power supply voltage boosting circuit for a semiconductor device, comprising:
- a power line for delivering a boosted voltage;
- an oscillator for generating an oscillation signal;
- a detector for enabling the oscillation signal when the boosted voltage is lower than a target voltage level;
- a first boosted voltage generating section coupled to the power line and having a first pumping circuit and a first precharge circuit; and
- a second boosted voltage generating section coupled to the power line and having a second pumping circuit and a second precharge circuit;
- wherein the first and second precharge circuits are coupled together such that one of the precharge circuits uses a voltage which is pumped by the other precharge circuit; and
- wherein the first pumping circuit includes:
  - a first pumping capacitor having one electrode for receiving a complementary oscillation signal and another electrode coupled to a first pumping node;
  - a first transistor having a second terminal and a third terminal commonly coupled to a power supply voltage and a first terminal coupled to the first pumping node; and
  - a second transistor having a second terminal and a third terminal commonly coupled to the first pumping node and a first terminal coupled to the power line.

14. The power supply voltage boosting circuit according to claim 13, wherein the first precharge circuit includes:
- a second pumping capacitor having one electrode for receiving the oscillation signal and another electrode coupled to a second pumping node;
- a third transistor having a second terminal and a third terminal commonly coupled to the power supply voltage and a first terminal coupled to the second pumping node; and
- a fourth transistor having a second terminal and a third terminal commonly connected to the second pumping node and a first terminal coupled to the first pumping node of the first pumping circuit.

15. The power supply voltage boosting circuit according to claim 14, wherein the second pumping circuit includes:
- a third pumping capacitor having one electrode for receiving the oscillation signal and another electrode coupled to a third pumping node;
- a fifth transistor having a second terminal and a third terminal commonly coupled to the power supply voltage and a first terminal coupled to the third pumping node; and
- a sixth transistor having a second terminal and a third terminal commonly coupled to the third pumping node and a first terminal coupled to the power line.

16. The power supply voltage boosting circuit according to claim 15, wherein the second precharge circuit includes:
- a fourth pumping capacitor having one electrode for receiving the complementary oscillation signal and another electrode commonly coupled to a fourth pumping node and to a third terminal of the third transistor;
- a seventh transistor having a second terminal and a third terminal commonly coupled to the power supply voltage and a first terminal coupled to the fourth pumping node; and
- an eighth transistor having a second terminal and a third terminal commonly connected to the fourth pumping node and a first terminal coupled to the third pumping node;
- wherein the first through eighth transistors are connected in series.

17. The power supply voltage boosting circuit according to claim 11, wherein:
- the first precharge circuit and the second pumping circuit perform a precharge pumping operation and a main pumping operation, respectively, at a first transition of the oscillation signal; and
- the second precharge circuit and the first pumping circuit perform a precharge pumping operation and a main pumping operation, respectively, at a second transition of the oscillation signal.

18. A method for increasing the output voltage of a voltage boosting circuit, the voltage boosting circuit including: a first boosted voltage generating section having a first pumping circuit coupled to a power line for pumping the voltage of the power line during a first half cycle of an oscillation signal, and a first precharge circuit coupled to the first pumping circuit for precharging a first node in the first pumping circuit during a second half cycle of the oscillation signal; and a second boosted voltage generating section having a second pumping circuit coupled to the power line for pumping the voltage of the power line during a second half cycle of the oscillation signal, and a second precharge circuit coupled to the second pumping circuit for precharging a second node in the second pumping circuit during the first half cycle of the oscillation signal; the method comprising:
- using a voltage which is pumped by one of the precharge circuits to drive a transistor in the other precharge circuit.

* * * * *